United States Patent [19]

Aomura et al.

[11] 4,163,246
[45] Jul. 31, 1979

[54] SEMICONDUCTOR INTEGRATED CIRCUIT DEVICE EMPLOYING A POLYCRYSTALLINE SILICON AS A WIRING LAYER

[75] Inventors: Kunio Aomura; Kenji Okada, both of Tokyo, Japan

[73] Assignee: Nippon Electric Co., Ltd., Tokyo, Japan

[21] Appl. No.: 874,551

[22] Filed: Feb. 2, 1978

[30] Foreign Application Priority Data

Feb. 7, 1977 [JP] Japan .................................. 52-12760

[51] Int. Cl.² .......................................... H01L 23/48
[52] U.S. Cl. ........................................ 357/68; 357/59; 357/71
[58] Field of Search ........................... 357/59, 68, 71

[56] References Cited

U.S. PATENT DOCUMENTS

| 3,667,008 | 5/1972 | Katnack | 357/59 |
| 3,964,092 | 6/1976 | Wadham | 357/59 |

*Primary Examiner*—Edward J. Wojciechowicz
*Attorney, Agent, or Firm*—Hopgood, Calimafde, Kalil, Blaustein & Lieberman

[57] ABSTRACT

In a semiconductor integrated circuit, an insulating film is formed on a major surface of the substrate. An elongated wiring layer including a polycrystalline silicon layer is formed on the insulating layer. At least one metallic area is formed over the wiring layer except at the ends of the wiring layer.

13 Claims, 10 Drawing Figures

SEMICONDUCTOR INTEGRATED CIRCUIT DEVICE EMPLOYING A POLYCRYSTALLINE SILICON AS A WIRING LAYER

BACKGROUND OF THE INVENTION

1. Field of the Invention

The present invention relates generally to semiconductor devices, and more particularly, to a semiconductor integrated circuit device employing a polycrystalline silicon thin film as a wiring layer.

2. Description of the Prior Art

A polycrystalline silicon thin film is commonly employed in integrated circuit devices because of the simplicity and convenience of manufacturing such devices, the high degree of integration that can be attained, and the like. One particular application of a polycrystalline silicon thin film to the electrodes and wiring layers of an integrated circuit device is disclosed, for example, in U.S. Pat. No. 3,699,646. However, in integrated circuits in which a polycrystalline silicon thin film is utilized for wiring, there is a shortcoming that the resistance of the thin film is high. A structure having a metal silicide film on a polycrystalline silicon film has been proposed, such as discussed in SOLID-STATE SCIENCE AND TECHNOLOGY, December issue 1975, pp. 1714-1718, but this does not provide a basic solution to the problem.

Namely, the specific resistivity of a polycrystalline silicon wiring layer is hardly reduced to $10^{-3}\Omega$-cm or lower, even if the impurity concentration therein is increased to a higher possible value, for example, $10^{18}$ atoms/cm$^3$ or higher. If the thickness of the layer is increased for the purpose of reducing the resistance, the level difference between the upper surface of the polycrystalline layer and the surface of the insulating film on which the polycrystalline layer is formed becomes large, so that the second wiring layer provided on these surfaces is liable to be broken. Therefore, it is not practical to increase the thickness of the polycrystalline silicon layer exceed a certain value. On the other hand, the length of the wiring layer is determined by the device design. Therefore, the wiring layer in the prior art integrated circuit devices inevitably has a high resistance.

Consequently, the design of an integrated circuit device is achieved by means of various compromises such that instead of device arrangement of degree-of-integration predominant type, device arrangement of wiring predominant type is employed at the sacrifice of degree-of-integration, or wirings made of a low-resistance metal, such as aluminum, are modified from a single-layer structure to a double-layer structure by increasing the steps of processing to assure the degree of integration.

SUMMARY OF THE INVENTION

It is an object of the present invention to provide a semiconductor device having low-resistance wiring layers.

It is another object of the present invention to provide a semiconductor device having a plurality of lower wirings and a plurality of upper wirings crossed over the lower wirings via insulating films, in which the resistance of the lower wiring can be reduced without sacrificing reliability and degree-of-integration.

It is still another object of the present invention to provide a semiconductor device having a multi-layer wiring structure made of polycrystalline silicon films, in which a low-resistance wiring structure is realized without sacrificing reliability and degree-of-integration.

It is yet another object of the present invention to provide a semiconductor device, in which wiring consisting of a polycrystalline silicon film and a metal silicide film is employed as one layer of wiring in multi-layer wirings, and in which the resistance of the wiring structures is made low without sacrificing reliability and degree-of-integration.

According to the feature of the invention, there is provided a semiconductor device comprising a semiconductor substrate, a insulating film formed on a major surface of the semiconductor substrate, a wiring layer of a polycrystalline silicon layer or a double layer composed of a polycrystalline silicon layer and a metal silicide layer formed on the insulating film, and a metal layer formed on the wiring layer except at an end of the first wiring layer.

According to another feature of the invention, there is provided a semiconductor substrate, a first insulating film formed on the semiconductor substrate, a first wiring layer made of a polycrystalline silicon film, or a polycrystalline film and a metal silicide film, formed on the first insulating film, a second insulating film formed on the first wiring layer, a plurality of second wiring layers formed on the second insulating film and crossed over the first wiring layer, and metal layers connected electrically to the first wiring layer between the second wiring layers as separated from the second wiring layers and not extending on the second wiring layers.

According to yet another feature of the present invention, in a semiconductor device, each of a plurality of apertures selectively formed in the second insulating film, which covers the first wiring layers deposited on the first insulating film covering one major surface of a semiconductor substrate, is covered by a metal layer having a low resistance.

In the structure of the invention, the resistance of the first wiring layer is reduced by the metal layers without sacrificing reliability and degree of integration.

Figure 1A:
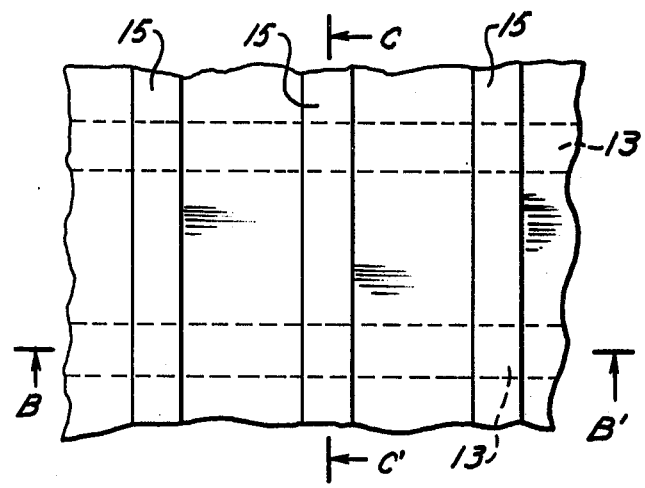
FIGS. 1(A), 1(B) and 1(C) illustrate a prior art semiconductor device, FIG. 1(A) being a plan view, FIG. 1(B) being a cross section taken along section line B-B' in FIG. 1(A) as viewed in the direction of the arrows, and FIG. 1(C) being another cross section taken along section line C-C' in FIG. 1(A) as viewed in the direction of the arrows.
Figure 1B:
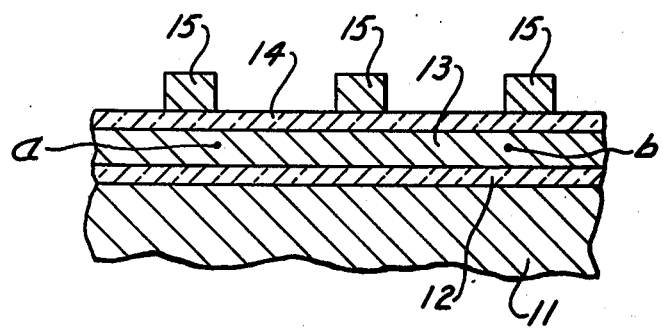
Figure 1C:
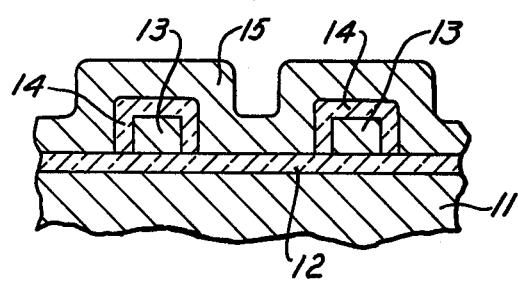

In the prior art semiconductor device shown in FIG. 1(A), FIG. 1(B) and FIG. 1(C), a plurality of first wiring layers 13 made of polycrystalline silicon films are provided on an insulating film such as, for example, a silicon dioxide film 12 covering one major surface of a silicon substrate 11. Wiring layers 13 are covered by an insulating films 14, on which are provided a plurality of second wiring layers 15 made of a metal such as aluminum intersecting the first wiring layers 13 at right angles.

The thickness of each polycrystalline silicon layer 13 cannot be increased, because the level difference between the upper surface of the insulating film 14 on the polycrystalline silicon layer 13 and the upper surface of the insulating film 12 formed on the semiconductor substrate 11 becomes large, so that the second wiring layers 15 provided on these upper surfaces are liable to be broken.

Accordingly, if the thickness of the polycrystalline silicon layer 13 having a specific resistivity of $10^{-3}$ $\Omega$-cm is 0.5 $\mu$m, the width of the same is 10 $\mu$m and the distance between the positions marked a and b FIG. 1(B) is 100 $\mu$m, then the resistance between the positions a and b will be as high as 200$\Omega$.

On the other hand, if the wiring layer 13 is composed of a polycrystalline film having a thickness of 0.2 $\mu$m and a metal silicide film having a thickness of 0.3 $\mu$m formed on the polycrystalline film, the specific resistivity of the metal silicide film is about $10^{-4}$ $\Omega$-cm and, therefore, the resistance between positions a and b will be reduced to about 30$\Omega$. However, even with such a resistance value, the wiring layer cannot be said to be completely acceptable. For instance, in a memory device constructed of single-transistor memory cells, as shown in Electronics, Feb. 19, 1976 issue, pp. 116-121, word lines made of polycrystalline silicon have a high resistance, and, therefore, the power consumption and time delay in the memory device are still considerably high.

DESCRIPTION OF THE PREFERRED EMBODIMENTS

First Preferred Embodiment

Figure 2A:
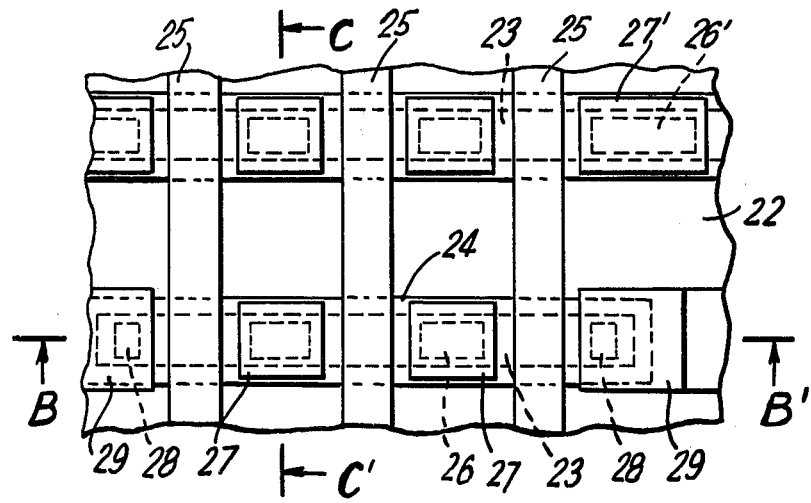
FIGS. 2(A), 2(B) and 2(C) illustrate an integrated circuit device according to a first embodiment of the invention, FIG. 2(A) being a plan view, FIG. 2(B) being a cross section taken along section line B-B' in FIG. 2(A) as viewed in the direction of the arrows, and FIG. 2(c) being another cross section taken along section line C-C' in FIG. 2(A) as viewed in the direction of the arrows.
Figure 2B:
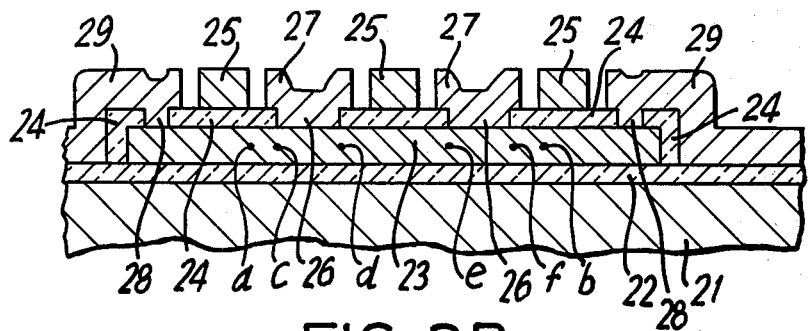
Figure 2C:
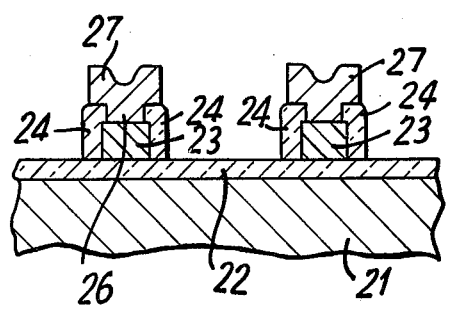

In the first embodiment of the present invention as illustrated in FIGS. 2(A), 2(B), and 2(C), an insulating film 22 covers a silicon substrate 21. Wiring layers 23 made of a deposited polycrystalline silicon thin film are formed on insulating film. After the silicon thin wiring layers 23 has been covered by an insulating film 24, apertures 26 and 26' are selectively formed in the portions on the insulating film 24 where a plurality of metal wirings 25 made of aluminum or the like formed thereon do not pass. Apertures 26 and 26' extend up to the silicon thin wiring layers 23, and are covered by low-resistance metal thin layers 27 and 27'. External connection wiring layers 29 are connected to the polycrystalline silicon wiring layer 23 through other apertures 28.

By employing the above-described structure according to the present invention, the following advantages are obtained. Although the specific resistivity of the polycrystalline silicon thin film used for the wiring layer is $10^{-3}$ $\Omega$-cm or more, the specific resistivity of metals has a far lower value, of the order of $10^{-6}$ $\Omega$-cm. In order to lower the resistance of the wiring layer employing solely a silicon thin film, it is necessary either to increase the film thickness or to broaden the wiring width. However, an increase in the thickness of the wiring layer 23 will result in an increase of a level difference, so that breaking of a metal wiring layer 25 formed thereon is liable to be induced. The broadening of the width of wiring layers 23 will result in an increase of the area, so that both of these approaches to modifying the wiring layer 23 involve problems with respect to reliability and cost. In contrast, in the structure according to the present invention, since a metal thin layer 27 is partly employed together with a silicon wiring layer 23, the resistance at that portion is determined predominantly by the resistance of the metal thin layer 27, so that the resistance of the overall wiring is lowered by a corresponding amount, and, therefore, there is provided a margin for the design of the device.

For instance, as shown in FIG. 2(B), in the case where the distance between c and d and the distance between e and f are selected to be 25 $\mu$m, the distances between a and c and between f and b are selected to be 10 $\mu$m, the distance between d and e is selected to be 30 $\mu$m, the thickness of the polycrystalline silicon wiring layer 23 is selected to be 0.5 $\mu$m, the width of wiring layer 23 is selected to be 10 $\mu$m and the specific resistivity of the same is selected to be $10^{-3}$ $\Omega$-cm, if the metal thin layer 27 does not exist, then the resistance between a and b is 200$\Omega$, whereas if the metal thin layers 27 were made of aluminum are provided, then the resistance between a and b would be reduced to about one-half, because the specific resistivity of aluminum is about $10^{-6}$ $\Omega$-cm. As a result, the resistance of this portion can be substantially neglected with respect to the polycrystalline silicon layer. Even in the case where metal silicide having a thickness of 0.3 $\mu$m is employed on the surface of the polycrystalline silicon film of 0.2 $\mu$m thickness, since the specific resistivity of these films and the metal (aluminum) thin film are different by about 2 orders, the overall resistance can also be reduced to about one-half by the existence of the metal thin film if the same dimensions as the above-described embodiment are employed. For the metal thin layers 27, besides aluminum, gold or other substances which can be normally used for wiring in a semiconductor device, could also be employed. In the case where the thickness of the polycrystalline silicon layer is, for example, 0.5 $\mu$m then practically a thickness of the metal thin layers 27 of 0.1 $\mu$m or greater is satisfactory. In addition, since this metal thin layers 27 can be formed simultaneously with the formation of aluminum metal wirings 25 and external connection wirings 29, there is no need to add a special manufacturing process for the formation of the metal layers 27.

Furthermore, if the length of the metal layer contact part (c-d, e-f) taken in the lengthwise direction of the first wiring layer 23 is selected to be twice or more of the thickness t and the width of the metal layer contact part taken in the widthwise direction of the first wiring layer 23 is selected to be a half or more of w, then the existence of the width the metal layer 27 is especially effective, because in the portion where the metal layer 27 exists almost all the current flows through the metal layer 27.

Figure 3A:
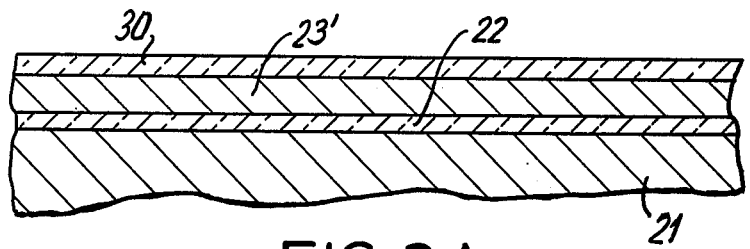
FIGS. 3(A), 3(B) and 3(C) are cross sections views showing successive steps in the manufacture of the semiconductor device according to the embodiment illustrated in FIGS. 2(A), 2(B) and 2(C)
Figure 3B:
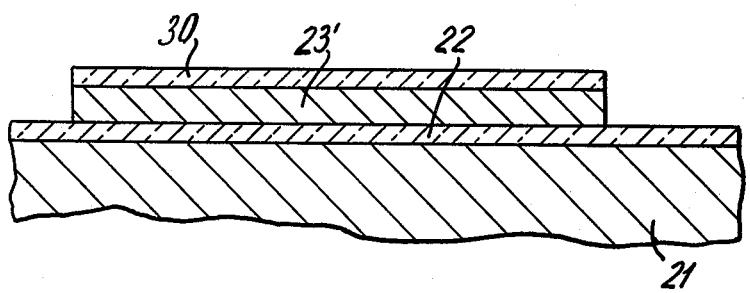
Figure 3C:
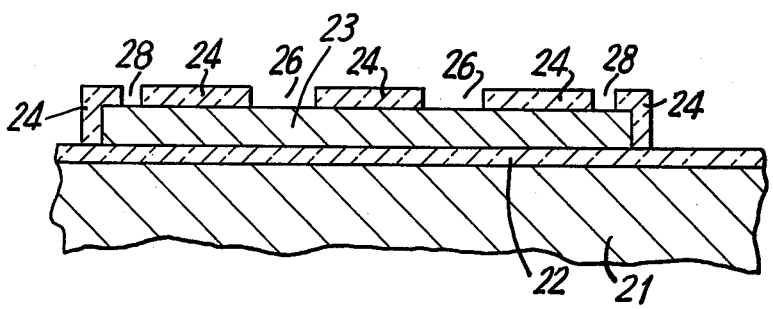

The process of manufacturing the semiconductor device according to the above-described preferred embodiment is now described with reference to FIGS. 3(A), 3(B) and 3(C), which show in cross-section the successive steps in the manufacturing process. As therein shown, silicon substrate 21 is subjected to thermal oxidation to cover the surface of the substrate 21 with a silicon oxide film 22 of about 0.5 $\mu$m in thickness. A polycrystalline silicon thin film 23' is then deposited on the silicon oxide film 22 to a thickness of about 0.7 $\mu$m, and thermal oxidation is again effected to cover the surface of the silicon thin film 23' with a silicon oxide film 30 of about 0.2 μm (FIG. 3(A)). The polycrystalline silicon film 23' then has a thickness of about 0.6 μm. The silicon film is preferably deposited by thermally decomposing monosilane at a temperature of 650° C.

Subsequently, the silicon oxide film 30 on the silicon thin film 23' is selectively removed by a photo-etching technique, and the polycrystalline silicon thin film 23' is also selectively removed by making use of the remaining silicon oxide film 30 as a mask (FIG. 3(B)).

The remaining silicon oxide film 30 is then removed, and diffusion of phosphorus is then effected to make phosphorus atoms diffuse into the silicon thin film 23. The surface of the diffused silicon layer 23 is again covered with a silicon oxide film 24 of about 0.3 μm in thickness, and apertures 26 and 28 are formed in the silicon oxide film 24 extending up to the silicon thin layer 23 by a photo-etching technique (FIG. 3(C)). By effecting the above-described diffusion of phosphorus at a temperature of 1000° C., for 30 minutes, the specific resistivity of the silicon thin layer is reduced to about $10^{-3}$ Ω-cm. In addition, by forming the silicon oxide film 24 through thermal oxidation, the thickness of the polycrystalline silicon thin layer 23 is reduced to about 0.5 μm.

Aluminum is then deposited up to a thickness of about 1.5 μm, and wirings, the metal layers of this invention, and external connection wirings 25, 27 and 29 are formed by making use of a photo-etching technique. In this step of the process, for the purpose of forming the metal layer 27, the thickness of the aluminum layer could be at least 0.1 μm. Next, heat treatment is effected for 30 minutes within a nitrogen atmosphere to obtain ohmic contact between silicon and aluminum, and a semiconductor element is thereby completed (FIG. 2). At this moment, the specific resistivity of the aluminum is about $10^{-6}$ Ω-cm which is sufficiently lower than the specific resistivity of the silicon thin film. The wiring layers 25 wirings formed on the silicon oxide films 24 cover the silicon layers 23. The wiring layers 29 are wirings for connecting the silicon layer 23 to external circuits and the metal layers 27 are provided for the purpose of lowering the resistance of the silicon wiring layers 23. Therefore, among the apertures shown in FIG. 3(C), the apertures 28 are provided for connection to the external circuits, and the apertures 26 are provided for practicing the present invention.

Second Preferred Embodiment

Figure 4:
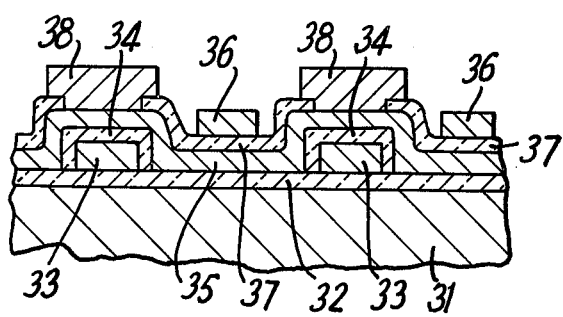
FIG. 4 is a cross section view showing a second preferred embodiment of the present invention.

In the second embodiment of the present invention, as illustrated in FIG. 4, an oxide film 32 is formed on a semiconductor substrate 31. A plurality of polycrystalline silicon layers 33 are provided on the oxide film 32 forming first layers of wiring, and on the silicon a plurality of polycrystalline silicon layers 35 are provided on silicon layers 33, forming second layers of wiring intersection at right angles to the first layers of wiring by the intermediary of insulating films 34. Furthermore, third wiring layers formed of aluminum are formed in parallel to the first wiring layers consisting of the polycrystalline silicon layers 33, to establish a three-layer structure. According to the present invention, the second wiring layers 35 are provided with metal portions 38 consisting of a metal such as aluminum to reduce the overall resistance of the second wiring layer 35.

Example of Application

The present invention can be effectively practiced in a memory device. For instance, in a memory device constructed of single-transistor memory cells, in which the first wiring layers are word lines made of polycrystalline silicon films and connected to the gates of transistors, and bit lines made of a plurality of second aluminum wiring layers and connected to the drains of transistors are provided above the plurality of word lines by the intermediary of oxide films, if the present invention is applied to the word lines, then the resistance of the word line is reduced, so that power consumption can be reduced and the performance of the memory device can thus be enhanced.

While the invention has been described above in connection to several presently preferred embodiments, it will be appreciated that modifications may be made therein, all without departing from the spirit and scope of the invention.

We claim:

1. A semiconductor device comprising a semiconductor substrate, an insulating film formed on a major surface of said semiconductor substrate; a first wiring structure including an elongated silicon layer formed on said insulating film, first and second electrical connections respectively made to a first and a second portion of said silicon layer, and at least one metallic layer electrically coupled to a third portion of said silicon layer between said first and second portions; and a second wiring structure including a conductive layer running over and isolated from a fourth portion of said silicon layer between said first and second portions, said conductive layer of said second wiring structure being isolated from said metallic layer of said first wiring structure, and said fourth portion being positioned between said third portion and one of said first and second portions.

2. A semiconductor device of claim 1, in which said first and second portions are located at the ends, in the length direction, of said elongated silicon layer.

3. A semiconductor device of claim 1, in which said elongated silicon layer is made of a single polycrystalline silicon film.

4. A semiconductor device of claim 1, in which said first wiring layer further includes a metal silicide film formed over the surface of said elongated silicon layer.

5. A semiconductor device comprising a semiconductor substrate; a first insulating film on a major surface of said semiconductor substrate; a first wiring structure including an elongated silicon layer formed on said first insulating film, first and second electrical connections respectively to a first and a second separate portion of said silicon layer, a second insulating film formed on said elongated silicon layer, at least one aperture formed in said second insulating film and extending to the surface of a third portion of said silicon layer between said first and second portions, and a metal layer electrically coupled through said aperture to said third portion of said silicon layer; and at least two second wiring structures which include conductive layers running over and electrically isolated from fourth and fifth portions of said silicon layer, respectively, between said first and second portions, said conductive layers of said second wiring structures being electrically isolated from said metal layer of said first wiring structure, and said fourth and fifth portions being positioned between said third portion and said first portion and between said third portion and said second portion, respectively.

6. A semiconductor device of claim 5, in which said metal layer and said conductive layers of said second wiring structures are made of the same material.

7. A semiconductor device of claim 5, in which said first wiring structure further includes a metal silicide film formed over the surface of said elongated silicon layer and said metal layer is coupled to said silicon layer through said metal silicide film.

8. A semiconductor device of claim 5, in which the length of said aperture in the length direction of said silicon layer of said first wiring structure is at least twice the thickness of said silicon layer of said first wiring structure, and the width of said aperture in the width direction of said silicon layer of said first wiring structure, is at least a half of the width of said silicon layer of said first wiring structure.

9. A semiconductor device comprising a semiconductor substrate; an insulating film on a major surface of said semiconductor substrate; a first wiring structure including a plurality of elongated silicon layers formed on said insulating film, electrical connections to a first and a second separate portion of each of said silicon layers, and at least one metal layer electrically coupled to a third portion of each of said silicon layers between said first and second portions; and a second wiring structure including a plurality of conductive layers running over different portions of any one of said silicon layers between said first and second portions and electrically isolated from said one silicon layer, said metal layer coupled to said one silicon layer being isolated from and positioned between said conductive layers running over said one silicon layer.

10. A semiconductor device of claim 9, in which said elongated silicon layers are made of polycrystalline silicon films.

11. A semiconductor device of claim 9, in which said first wiring structure further includes a metal silicide film formed over the surface of said elongated silicon layer.

12. A semiconductor memory device comprising a semiconductor substrate; a plurality of memory cells formed in said semiconductor substrate; an insulating film on a major surface of said semiconductor substrate; a plurality of first wiring structures for connecting said memory cells, each of said first wiring structures including an elongated silicon layer, a pair of electrical connections for connecting said memory cells to a first and a second separate portion of said silicon layer, at least one metallic portion electrically coupled to a third portion of said silicon layer between said first and second portions; and a plurality of second wiring structures for connecting said memory cells, each of said second wiring structures including a conductive layer running over and electrically isolated from a fourth portion of each of said silicon layers between said first and second portions, each of said conductive layers of said second wiring structures being electrically isolated from each of said metallic layers of said first wiring structures, and in each of said silicon layers, said fourth portion being positioned between said third portion and one of said first and second portions.

13. A semiconductor memory device of claim 12, in which said first wiring structure further includes a metal silicide film formed over the surface of said elongated silicon layer.

* * * * *